United States Patent
Engert et al.

(10) Patent No.: US 9,209,100 B2
(45) Date of Patent: Dec. 8, 2015

(54) HOUSING HAVING SEPARATE GETTER CHAMBER FOR DEVICE OPERATING UNDER VACUUM

(75) Inventors: Tobias Engert, Abtsteinach (DE); Ivan Kojouharov, Zornheim (DE); Juergen Gerl, Dietzenbach (DE)

(73) Assignee: GSI HELMHOLTZZENTRUM FUER SCHWERIONENFORSCHUNG GMBH, Darmstadt (DE)

( * ) Notice: Subject to any disclaimer, the term of this patent is extended or adjusted under 35 U.S.C. 154(b) by 563 days.

(21) Appl. No.: 13/387,127

(22) PCT Filed: Jul. 14, 2010

(86) PCT No.: PCT/EP2010/004266
§ 371 (c)(1),
(2), (4) Date: Jan. 26, 2012

(87) PCT Pub. No.: WO2011/012224
PCT Pub. Date: Feb. 3, 2011

(65) Prior Publication Data
US 2012/0128508 A1    May 24, 2012

(30) Foreign Application Priority Data
Jul. 27, 2009   (DE) .......................... 10 2009 034 837

(51) Int. Cl.
*H01L 23/26* (2006.01)
*H01J 41/20* (2006.01)

(52) U.S. Cl.
CPC ................. *H01L 23/26* (2013.01); *H01J 41/20* (2013.01)

(58) Field of Classification Search
CPC ..................... F04B 37/00–37/20; H01J 41/12; H01J 41/14; H01J 41/16; H01J 41/18; H01J 41/20; H01L 23/26
USPC .......................................... 417/48, 49, 50, 51
See application file for complete search history.

(56) References Cited

U.S. PATENT DOCUMENTS

| 3,497,070 | A | * | 2/1970 | Eibich et al. .................. 210/347 |
| 4,297,082 | A | * | 10/1981 | Wurtz et al. .................... 417/51 |
| 5,012,102 | A | | 4/1991 | Gowlett |
| 5,252,408 | A | * | 10/1993 | Bridges et al. ................ 428/621 |
| 5,317,157 | A | * | 5/1994 | Yoshida et al. ............... 250/352 |
| 5,328,336 | A | | 7/1994 | Nowobilski |
| 5,375,423 | A | | 12/1994 | Delatte |

(Continued)

FOREIGN PATENT DOCUMENTS

| DE | 69006904 T2 | 6/1994 |
| DE | 4324709 A1 | 1/1995 |
| WO | 9503555 A1 | 2/1995 |

OTHER PUBLICATIONS

DIN 8580, Deutsches Institut für Normung, e.V., Berlin, p. 2-13, Dec. 2003.

(Continued)

*Primary Examiner* — Peter J Bertheaud
*Assistant Examiner* — Dnyanesh Kasture
(74) *Attorney, Agent, or Firm* — Leydig, Voit & Mayer, Ltd.

(57) ABSTRACT

A housing for a device operated under at least one of a vacuum and a protective gas includes at least one housing interior space, at least one receiving region configured to receive at least one getter material, and a connection between the at least one housing interior space and the at least one receiving region. The connection includes a particle-impervious bond.

24 Claims, 5 Drawing Sheets

(56) References Cited

U.S. PATENT DOCUMENTS

| | | | |
|---|---|---|---|
| 5,456,740 A * | 10/1995 | Snow et al. | 96/11 |
| 5,604,349 A * | 2/1997 | Berst et al. | 250/370.15 |
| 6,174,349 B1 * | 1/2001 | DeSantis | 95/205 |
| 6,908,595 B1 | 6/2005 | Biel et al. | |
| 7,288,501 B2 * | 10/2007 | Auer et al. | 502/182 |
| 2005/0150198 A1 * | 7/2005 | Morrell et al. | 55/385.1 |
| 2007/0129791 A1 * | 6/2007 | Balaji | 623/1.44 |
| 2008/0038132 A1 * | 2/2008 | Ihara et al. | 418/3 |

OTHER PUBLICATIONS

DIN 1623, Deutsches Institut für Normung, e.V., Berlin, p. 1-12, May 2009.

DIN EN 10029, Deutsches Institut für Normung, e.V., Berlin, p. 1-15, Feb. 2011.

EN 20286: DIN EN 286-1, Deutsches Institut für Normung, e.V., Berlin, p. 1-49, Nov. 2010.

EN 20286: DIN EN 286-2, Deutsches Institut für Normung, e.V., Berlin, p. 1-30, Nov. 2010.

EN 20286: Toleranzen und Passungen, www.mitcalc.com, p. 1-12, retrieved Jun. 11, 2012.

St 172 SAES getter, p. 1-14, retrieved from http://www.saesgetters.com/documents/st_171-172_2011_1710.pdf on Feb. 6, 2012.

European Patent Office, International Search Report in International Patent Application No. PCT/EP2010/004266 (Sep. 29, 2010).

* cited by examiner

HOUSING HAVING SEPARATE GETTER CHAMBER FOR DEVICE OPERATING UNDER VACUUM

CROSS REFERENCE TO RELATED APPLICATIONS

This application is a U.S. National Phase application under 35 U.S.C. §371 of International Application No. PCT/EP2010/004266, filed on Jul. 14, 2010, and claims benefit to German Patent Application No. DE 10 2009 034 837.9, filed on Jul. 27, 2009. The International Application was published in German on Feb. 3, 2011 as WO 2011/012224 A1 under PCT Article 21 (2).

FIELD

The present invention relates to a housing, in particular a housing for devices operated under vacuum and/or protective gas that has at least one housing interior space and at least one receiving region for accommodating a getter material. The present invention also relates to a device, in particular a device operated under vacuum and/or protective gas.

BACKGROUND

In a research environment, many measuring tasks require the use of measuring elements that must be protected from external influences. These may include temperature influences (i.e., as a very general example, too high or too low temperatures), material influences, vibrational influences and the like. Such a protection is normally needed to protect the often sensitive measuring devices from damage or destruction. Alternatively or additionally, the external influences may also lead to a falsification of the measuring results, respectively to a degradation of the measuring accuracy. Understandably, both effects are undesirable.

Gamma spectrometers used for gamma radiation spectroscopy constitute one example among many. Such gamma spectrometers are used in many research fields and in industrial applications. High-purity germanium detectors, which exhibit excellent energy resolution and a high detection probability, have proven effective. Such gamma detectors have very sensitive surfaces. It is, therefore, necessary to operate the gamma detectors under vacuum (preferably high vacuum or ultra-high vacuum) to order to protect the sensitive surfaces of the actual germanium detector from damage caused by ambient air. However, the germanium detectors react sensitively, not only in response to gaseous loading, but also to contamination of the surfaces thereof by solid substances, in particular. In a first approach, both requirements can be satisfied by encapsulating the germanium detector in a closed housing.

However, an additional problem arises when the (ultra-) high vacuum needs to be maintained in the closed housing for extended periods of time. At such high vacuums, namely also given walls of metal (for example, stainless steel), a considerable outgassing of the material can occur over time periods of several weeks or months if countermeasures, such as, in particular, surface pretreatment in the preliminary stages are not taken. This necessitates continuous re-pumping of the housing interior accommodating the detector, in order to maintain the (ultra-) high vacuum. If "classic" pumping (which is absolutely possible) is used for this purpose, it has the effect of making the entire detector unit hardly movable and, moreover, normally extremely sensitive to vibrations. In addition, the detector unit also becomes significantly larger and disproportionately more expensive.

For that reason, what are generally referred to as getter elements are normally used for the long-term, continuous pumping of such detector units. They are capable of permanently binding gaseous substances by chemical and/or physical sorption. Such getter elements can thus be advantageously used for long periods of time as pumps for closed capsules.

In the interim, to ensure that the getter material is not prematurely exhausted by the sorption of gases prior to the evacuation and vacuum-tight sealing of the housing, thermally activable getter elements are normally used. These elements essentially begin their sorption activity only when heated to temperatures of typically over 450° C. up to 900° C. In practice, thusly activable getter elements are also included in the housing and subsequently brought to the activation temperature by the application of an electric heating current (corresponding current leads must be provided for the getter element). A typical example of such a thermally activable getter element is a commercial St 172 SAES getter having the trade name HIS/7-6. In some instances, even more complex activation cycles (such as repeated heating and cooling) are needed to optimally activate the getter element.

The International Patent Application WO 95/03555 A1, for example, describes such a capsule for a detector which functions in an ultra-high vacuum. The gamma spectroscopy detector, which functions in an ultra-high vacuum, is housed in a capsule which has a bakeable getter element in order to maintain the ultra-high vacuum. The getter element is configured inside of the capsule in a getter sleeve that is separated from the detector by a thermal protection, in order not to damage the detector, which, in particular, can be a germanium detector, by overheating during baking of the getter. The thermal insulation of the detector and getter element is realized by a meandering channel configuration between the detector and the getter element. However, it turns out that it is not possible to provide an adequate pumping capacity through the getter element, particularly under the high vacuum present in a meandering channel configuration. Moreover, as before, the detector is still subject to contamination and damage from particles released from the getter element.

SUMMARY

In an embodiment, the present invention provides a housing for a device operated under at least one of a vacuum and a protective gas, the housing including at least one housing interior space, at least one receiving region configured to receive at least one getter material, and a connection between the at least one housing interior space and the at least one receiving region. The connection includes a particle-impervious connection.

BRIEF DESCRIPTION OF THE DRAWINGS

The present invention is explained in greater detail in the following on the basis of exemplary embodiments and with reference to the figures. Equivalent or mutually corresponding components are denoted by the same reference numerals in the figures. In the drawings.

Figure 4:
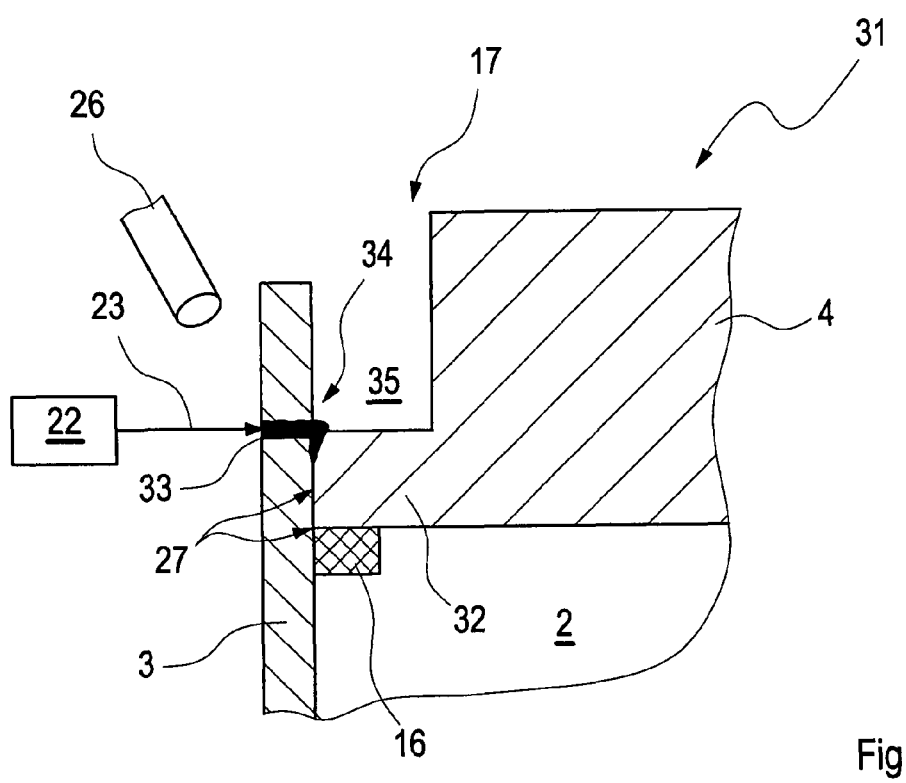

FIG. shows another embodiment of a weld seam for joining two assemblies, in a schematic cross section;

FIG. 4 shows yet another embodiment of a weld seam for joining two assemblies, in a schematic cross section;

FIGS. 5a-d show an embodiment for forming a vacuum-tight seal of the evacuation tube and the subsequent cutting-to-length thereof.

DETAILED DESCRIPTION

In an embodiment, the present invention provides a housing that is improved over the related art and that is suited, in particular, for devices operated under vacuum and/or protective gas. Moreover, an embodiment of the present invention provides a device that is improved over the related art, in particular, a device operated under vacuum and/or protective gas.

To this end, in an embodiment, a housing is provided that features at least one housing interior space, as well as at least one receiving region for accommodating a getter material, and that is formed in such a way that the connection between the at least one housing interior space and the at least one receiving region for accommodating a getter material, is realized as a particle impervious connection. In particular, the housing may be a housing for devices to be operated or operated under vacuum and/or protective gas. A getter material is generally understood, in particular, to be a material that is capable of binding substances (in particular, gaseous substances) by chemical and/or physical sorption and of thereby "removing" them from the ambient environment. Such a getter material makes it possible, in particular, to produce a partial vacuum, respectively a vacuum (especially a high vacuum and/or an ultra-high vacuum), respectively to maintain it over an extended period of time. In the case of the housing, a (normally large-volume) housing interior space is provided, which is used, for example, for accommodating a detector, some other measuring device and/or some other technical device. In addition, a receiving region is provided in the housing that may be used, in particular, for accommodating a getter material (as previously described) and, in some instances, also other devices, the preference being that they be configured to a certain extent separately from the housing interior space and/or from the technical devices accommodated therein. To ensure an especially high functionality, for instance, of a detector to be operated in a high vacuum that is accommodated in the housing interior space, it is desirable to ensure a most direct and immediate possible fluid communication (particularly with regard to gases) between the receiving region and the housing interior space. On the other hand, it is usually very harmful when particles, for example particles that form in the getter material, which is located in the receiving region of the housing, due to the sorption of gases and that are subsequently able to fall off from the getter material "block," come in contact with the device (such as a detector, for example) located in the housing interior space. Therefore, to at least substantially avoid this type of impairment of or damage to the device located in the housing interior space, embodiments of the present invention provide that the connection between the at least one housing interior space and the at least one receiving region be realized as a particle-impervious-connection. In this context, an important (often also the important) aspect of the connection is the imperviousness to particles, in particular to particles in solid form. However, depending on the particular requirement, other aspects of the particle-impervious connection, as provided in accordance with an embodiment of the present invention, may also include an especially short length of the connecting channel and/or an especially large cross section of the connecting channel. This type of design implementation makes it possible, for example, for a comparatively high pumping rate to be attained with the aid of the getter material. Depending on the particular requirement, it may also prove to be useful to develop the connection between the housing interior space and the receiving region to be thermally insulating as well (if indicated, in order in this way to also thermally protect the device located in the housing interior space). Conversely, this type of thermally insulating formation of the bond connection between the housing interior space and the receiving region may also prove to be disadvantageous, however, since a thermally insulating formation of this kind is normally associated with an increased resistance to the passage of fluids (in particular, of gases), particularly when it is a question of the fluid motion in the vacuum (especially a high vacuum and/or an ultra-high vacuum). Where necessary in this case, the thermal protection may also be realized by other technical measures.

In particular, it is provided in accordance with embodiments of the present invention that the housing design allow the particle-impervious connection to include at least one filter device. The filter device is preferably designed to allow gases, in some instances, also liquids and/or supercritical fluids, preferably having only low fluid resistance, to pass through, but, on the other hand, to largely prevent the passage of particles in solid form (in some instances, even particles in fluid form). The filter device may have a single- or multilayer design, for example. It is self-evident that the filter device may also employ one or a plurality of principles for filtering the particular particles to be restrained. At least one filter device preferably has at least one mesh material, preferably a plurality of mesh materials. Depending on the particular design, such mesh materials may substantially restrain particles, but, on the other hand, allow gaseous substances (in some instances, also other fluids) to pass through, impeded only relatively slightly. Depending on the density of the mesh material(s), particles exceeding a certain size may be restrained, for example. A further advantage of the mesh materials is that they may be fabricated of steel or of some other material that, on the one hand, has a high strength, and, on the other hand, is able to be simply treated in a way that ensures that it does not produce any virtual leakage, particularly during a vacuum operation (as the case may be, following an appropriate pretreatment, such as a preceding cleaning or a baking of the system, for example). Moreover, filters of a mesh material (or of a plurality of mesh materials) are commercially available in the field of foodstuffs, for example, making possible a cost-effective implementation of the approach according to an embodiment of the present invention. If a plurality of mesh materials are provided, they may be formed in any desired manner (partially) with a substantially identical mesh aperture and/or with different mesh apertures.

The housing is preferably designed in such a way that at least one receiving region for accommodating a getter material is formed at least regionally in a solidly constructed housing region. In particular, it may be a cover (in particular, a top cover and/or a bottom cover) of the housing that normally already has a relatively substantially thickness. Such a relatively large thickness is required, for example, to be able to accommodate lead-through devices, such as high-voltage bushings, gas feed lines, instrument leads and the like, it being noted that the lead-through devices should be designed to be vacuum-tight. Since the design implementation approach generally allows previously unutilized space to be used, it is possible to avoid "losing" hollow space that is needed for accommodating technical devices in the housing interior space. It is also generally possible to implement the particle-impervious connection in a technically especially simple manner.

In an embodiment, the present invention also provides for at least one getter material to be preferably located at least in one of the receiving regions for accommodating a getter material. It is especially preferred that at least one getter material be formed as thermally activable getter material. It is especially preferred that the getter material be activable at low temperatures. For example, the getter material may be activable at a temperature of up to 300° C., 400° C., 450° C., 600° C., 700° C. If, as provided in accordance with embodiments of the present invention, getter material is located in a receiving region that is joined to the housing interior space by a particle impervious bond connection, it is then possible to realize an especially high level of protection from damage or destruction of the technical device (for example, a detector, in particular a semiconductor detector) that is accommodated in the housing interior space, and, at the same time, still maintain a good pumping capacity through the getter material. When the getter material is a thermally activable getter material, it is then possible to substantially avoid a "consumption" of the getter material by sorption prior to the vacuum-tight sealing of the housing. In particular, it is also possible to maintain the vacuum (in particular, ultra-high vacuum) in the housing over a particularly long period of time, especially when the getter material is "reactivated" by thermal activation in predetermined time intervals. Any releasing of particles from the getter material in the course of the sorption of gases and/or during the heating of the getter material is normally rendered harmless by the particle impervious connection provided in accordance with embodiments of the present invention between the housing interior space and the receiving region.

It may be advantageous to provide at least one lead-through device that penetrates the housing wall and is preferably sealable fluid-tight. In this context, the concept of fluid-tight sealing may relate both to the lead-through device itself (for example, when it has a tubular design) and/or to the integration thereof in the housing wall (in particular, a cover). The lead-through device may be a high-voltage bushing, a current lead-through, instrument leads, gas feed lines, lines used for evacuating the housing interior space, etc. Particularly in the case that a fluid feed-through device is used (for example, a tube used for producing a vacuum), it is very readily possible, even upon completion of the housing and the seal, to evacuate the same and/or to fill it with a specific gas fill (such as a protective gas, for example). Subsequently to the filling, respectively evacuation processes, the fluid feed-through device may be sealed. To form the seal for the fluid feed-through device, a mechanical deformation (for example, produced by crimping) and or an integral seal (for example, by introducing a type of plug) may be produced. Accordingly, the housing (together with the detector configured therein) may be easily manipulated, in particular, as an independent unit. In particular, when an integral seal is used for the fluid feed-through device, the danger of later leakage may be effectively minimized by the fluid line.

In the case of the housing, it is also advantageous for at least one thermal insulation device to be provided in at least one join region in the vicinity of at least one material-to-material connection seam. To form a housing, one or more connection seams normally need to be provided along which the individual parts of the housing are joined together. It has proven effective, in particular, to form vacuum-tight connections, material-to-material connection seams (for example, soldered seams, welded seams, adhesive seams and the like). However, material-to-material connection seams normally require an application of thermal energy for the formation thereof. This energy may be introduced by a laser (for example, excimer laser, semiconductor laser, CO2 laser, dye laser, solid-state laser, gas laser), a sound source (for example, ultrasound source), an electron beam source, an electrical resistance device, an electrical high-voltage source, a frictional energy input device, or some other energy input device, into the region of the connection seam. If, at this point, a thermal insulation device is provided in the vicinity of at least one material-to-material connection seam, it is very simply possible for thermal energy, which may have been introduced into the region of the connection seam, to remain in the join region. In other words, in some instances, less thermal energy is removed from the join region. This may make it possible to reduce the heat input required in the particular case. Thus, the remaining regions of the housing may be protected from unnecessary thermal loading. It is self-evident that this is also true for parts, devices and other assemblies (such as measuring elements, sensors, cables, detectors, etc., for example) that may be connected to the housing in one specific region. The normally lower thermal loading of the material is usually accompanied by a reduction in the gases, respectively in other materials released in the course of the formation of the material-to-material connection seam. A material-to-material connection seam may also be understood in the present context as an array (for example, a linear array) of connection points. The thermal insulation device generally remains permanently in the housing (such as in a housing wall, for example). It is self-evident that this does not rule out a thermal insulation device being cured or filled, for example, following formation of the material-to-material connection seam. The provision of a thermal insulation device may, in fact, result in a weakening of the housing region in question, since the thermal insulation device generally has a lower structural strength than does the remaining material of the housing wall. Generally, however, as the inventors have surprisingly discovered, the disadvantageous effects of such a design are clearly more than compensated by the advantages thereof. This holds true, in particular, when the thermal insulation device—as mentioned above—is cured and/or filled following formation of the material-to-material connection seam, thereby making it normally possible to at least minimize any existing structural weakening. It may also be advantageous for at least one material-to-material connection seam to be formed as a thermal connection seam, in particular, as a brazed and/or welded seam. Thermal connection seams of this kind, where the material-to-material bond is normally formed by an at least regional melting or an at least regional softening of one of the materials involved, often produce especially stable and permanent connections. Such thermal connection seams are also often able to be formed very quickly. Once the influx of thermal energy ends, the join region normally cools very quickly, so that a bond capable of being subject to load is produced following a brief period of time. In particular, curing times, as generally occur when adhesives are used, may be shortened.

It may prove useful for at least one thermal insulation device to be formed as a region of thinned material, in particular as a recess, preferably as a groove-type recess and/or as a web-type projection. A thermal insulation device of this kind may be realized very simply by employing mechanical machining measures, such as material-removal machining processes and/or material-deformation machining processes. In particular, measures for fastening the thermal insulation device onto or into the housing region in question are generally unnecessary. The thermal insulation device may even be considered already during the manufacture of the particular housing (respectively of the housing assemblies), for example, when an extrusion-pressing process is used for the manufacture of at least parts of the housing.

In the case of the housing provided in accordance with an embodiment of the present invention, it may prove to be especially useful for at least two of the joined together join regions, in particular, two joined together housing parts, to differ in thickness, at least regionally. In previous material-to-material joining methods, the dissipation of heat through the thicker join region often necessitated a subsequent, very high input of thermal energy. This thermal energy input often had to be selected to be so high that the thinner join region could be damaged as a result. Accordingly, such bonds were often not stable or permanent enough. To some extent, it was not possible to produce such housing configurations, so that one had to resort to other joining methods.

The housing may be designed to allow at least two join regions of the housing to be provided at least regionally with a transition fit and/or a force fit, in particular with an H7 fit. This makes it easily possible to realize a defined positional pre-fixation of the housing parts in question relative to one another during manufacture of the housing. This kind of fit also makes it possible to suitably limit the depth of a weld seam or of a brazed seam. Another advantage may be derived when a such a fit provides a certain resistance to any substances potentially released during formation of the material-to-material connection seam. This makes it possible to effectively and very simply reduce and, in some cases, even essentially completely prevent a contamination of the housing interior. The use of an H7 fit has proven to be simple and cost-effective in terms of manufacturing and, at the same time, however, particularly effective.

In the case of the housing, it may prove to be especially advantageous for at least one connection seam to be provided between a housing casing and a housing cover and/or a housing bottom. Since it is customary for housing covers and/or housing bottoms to be provided with at least one lead-through device, they must typically be configured to be relatively thick. On the other hand, the housing casing may often have a relatively thin-walled design. Furthermore, the better part of detector applications requires that the housing have a relatively thin-walled design at least regionally, for example, to allow the gamma radiation to be detected to penetrate into the interior of the container in order to be able to act on the actual detector material. Therefore, it is generally desirable to join together such components having greatly differing thicknesses when constructing the housing. A connection seam of the type described at the outset has proven to be particularly effective in forming such bonds.

It may also prove to be beneficial for at least one housing part, in particular at least one join region to feature at least one material from the group including metal, metal alloys, aluminum, aluminum alloys, AlMg3, AlMg4.5Mn, steel, steel alloys, stainless steel, copper, copper alloys, nickel, nickel alloys, materials that feature low evaporation rates and/or materials that are free of evaporation. Such materials make it possible to very effectively form particularly durable and stable bonds. The already mentioned, unwanted evaporation of fluxing agents may also be reduced, minimized or even eliminated, especially in the case of materials that exhibit low evaporation rates, respectively that are evaporation-free.

It may be advantageous for at least one connection seam, in particular a material-to-material connection seam to have a separable design and, in particular, for it to be openable, preferably openable and resealable. This is possible, for example, when an additional material featuring an especially low melting point or material destruction point, is used to form the material-to-material connection seam. If the join region in question is brought to or above the appropriate temperature (which is very readily possible, in particular, due to the thermal insulation device), then the bond may be released in this manner, and, as the case may be, also resealed. It is self-evident that it is also possible to separate off the region having the connection seam. This may be accomplished mechanically, for example, using methods outlined in DIN 8580 under the generic term "separation" in accordance with the categorization of manufacturing methods. In particular, the separation may be accomplished using sawing, lathe turning, milling or filing processes. However, the separation may also be effected in another way, for example, through the use of a laser. The separation is made easily possible by providing a thermal insulation device, especially when it is in the form of a recess. It is self-evident that a separable construction is understood to not only include those designs that allow very frequent, respectively any desired number of separations and reconnections, but also those designs which allow only a certain number of separation processes (for example, two, three, four, five, six, seven, eight, nine or ten).

In an embodiment, the present invention also provides a device, in particular, a device operated under vacuum and/or protective gas that has at least one housing having the above described configuration. Analogously, such a device has the properties and advantages already described in connection with the housing provided in accordance with the present invention. In this context, the device may preferably be designed as a detector, in particular as a semiconductor detector. Such detectors or semiconductor detectors, which are located in a housing, are used, for example, for detecting radioactive radiation or particle radiation (alpha radiation, beta radiation, protons, neutrons, electrons, atomic nuclei, etc.). They must normally be operated in a vacuum and/or in a cooled state in order to exhibit the best possible measuring properties (in particular, good detection properties and low noise levels). Thus, the device according to embodiments of the present invention provides a significant improvement over known devices.

Figure 1:
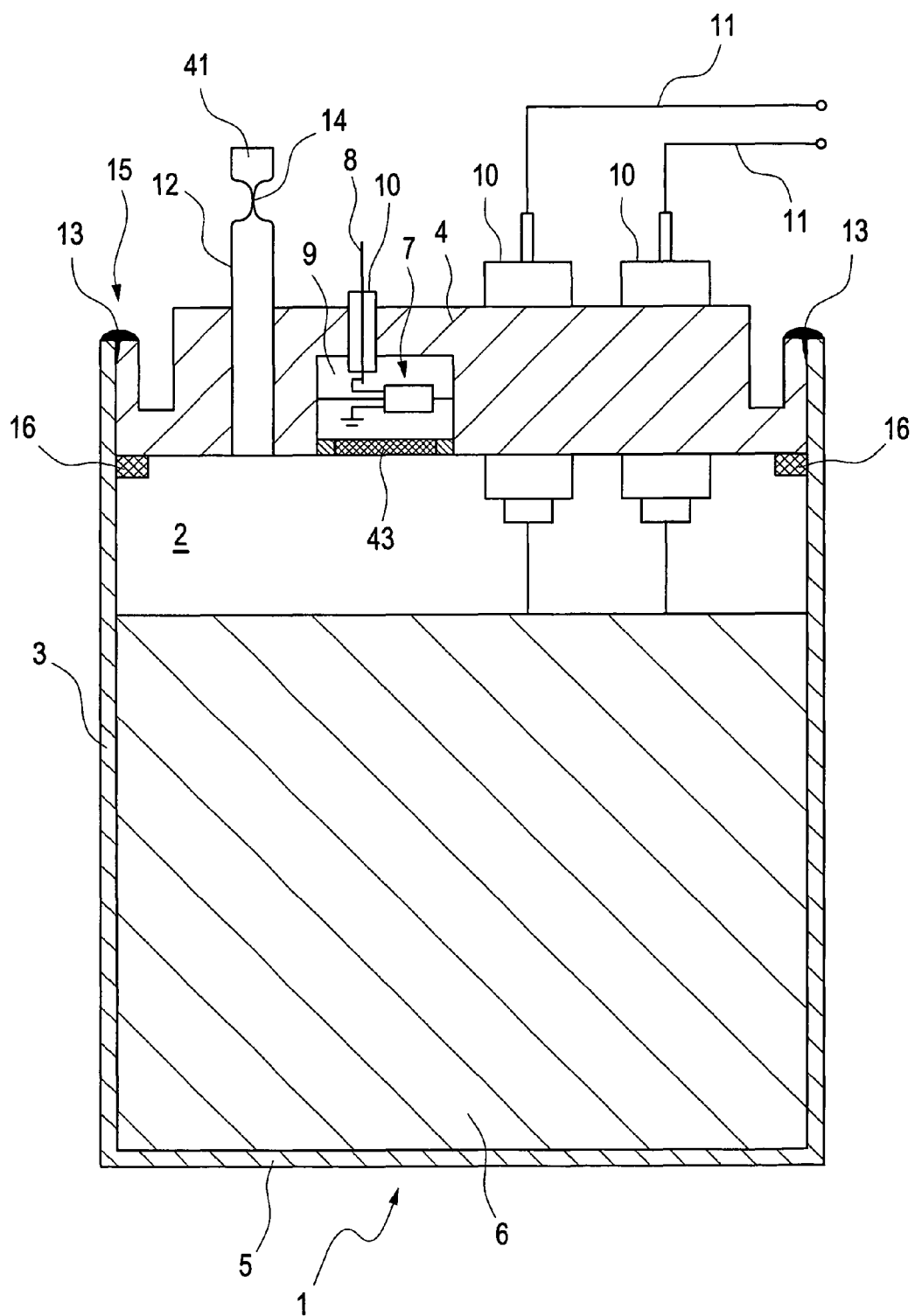
FIG. 1 shows an embodiment of a semiconductor detector that is encapsulated in a vacuum capsule, in a schematic cross section.

In a schematic cross-sectional view, FIG. 1 shows a first exemplary embodiment of a detector capsule 1. Detector capsule 1 has a hollow space 2 that is formed by capsule container 3 and by a cover 4. Capsule container 3 has a relatively thin-walled design. In the exemplary embodiment illustrated in the present case, capsule container 3 is made of a sheet aluminum having a wall thickness of 1 mm. Bottom 5 of detector capsule 1 is formed as an integral part of capsule container 3. Capsule container 3 may be produced in a deep-drawing process, for example. On the other hand, cover 4 of detector capsule 1 has a distinctly thicker-walled design. In the exemplary embodiment illustrated in the present case, the cover is 15 mm thick.

A semiconductor detector material 6 (for example, high-purity germanium) is contained in hollow space 2 of detector capsule 1. Semiconductor detector material 6 may be used, for example, for the spectroscopy of gamma radiation. To protect semiconductor detector material 6 and, in particular, the surfaces thereof, hollow space 2 of detector capsule 1 is evacuated, thus, is under a vacuum.

To be able to continuously maintain a vacuum in hollow space 2 of detector capsule 1 and thus to realize a longest possible service life of sealed detector capsule 1, the present example calls for continuous re-pumping of the high vacuum present in detector capsule 1. To this end, a thermally activable ion getter 7 is used in the exemplary embodiment illustrated in the present case. Configured below ion getter 7 is a filter element 43 that separates hollow space 9 formed in cover 4 and hollow space 2 formed in capsule container 3 according to particles. Thus, no particles from hollow space 9, which is formed in cover 4, are able to reach hollow space 2 formed in capsule container 3. Thermally activable ion getter 7 may be energized by an electric current via an electrical connecting lead 8, which is routed vacuum-tight through cover 4 of detector capsule 1, and is thereby heated (ground connection is implemented via cover 4 and/or capsule container 3 of detector capsule 1). In the present case, thermally activable ion getter 7 is located in a separate hollow space 9 that was formed in solidly constructed cover 4 (in the present case having a thickness of 15 mm) of detector capsule 1. This allows hollow space 2 present in the interior of capsule container 3 to be utilized in the best possible way to accommodate semiconductor detector material 6, and no volume needs to be provided in hollow space 2 to accommodate thermally activable ion getter 7.

Also discernible in cover 4 of detector capsule 1 are voltage bushings 10. Via these voltage bushings 10, semiconductor detector material 6 may be supplied with electric current via current leads 11; respectively, electrical signals (in particular, measurement signals) may be derived from semiconductor detector material 6. All voltage bushings (thus voltage bushings 10 of current leads 11, as well as the voltage bushing of electrical connecting lead 8) are designed to be vacuum-tight.

A further bore, into which an evacuation tube 12 is fit— likewise vacuum-tight—, is provided in cover 4. Hollow space 2 of detector capsule 1 may be evacuated via evacuation tube 12. Evacuation tube 12 may be secured in cover 4 using customary fastening methods. Adhesive bonding methods, brazing methods or welding methods are suited, for example. Since the bonding of evacuation tube 12 and cover 4 may be carried out temporally and spatially prior to the assembly of cover 4 in capsule container 3, joining methods may be used for this purpose that are actually problematic for the semiconductor detector material. In particular, welding methods and/or soldering methods may be used, where gaseous substances are released (for example, vaporization of fluxing agent fractions). It is self-evident that this also applies correspondingly to the assembly of voltage bushings 10.

Once the individual parts of detector capsule 1 (thus, in particular, semiconductor detector material 6, capsule container 3 and cover 4) have been assembled and the requisite electrical connections formed (in particular, between voltage bushings 10 in cover 4 and semiconductor detector material 6), weld seams 13 are produced which are used to seal detector capsule 2 vacuum-tight. In this context, evacuation tube 12 is initially still unsealed. At this point, hollow space 2 of detector capsule 1 is evacuated via evacuation tube 12. As soon as a vacuum is present in hollow space 2, evacuation tube 12 is also sealed vacuum-tight in a sealing region 14. This may be carried out, for example, using the sealing method sketched in FIGS. 5a-5d.

Figure 2:
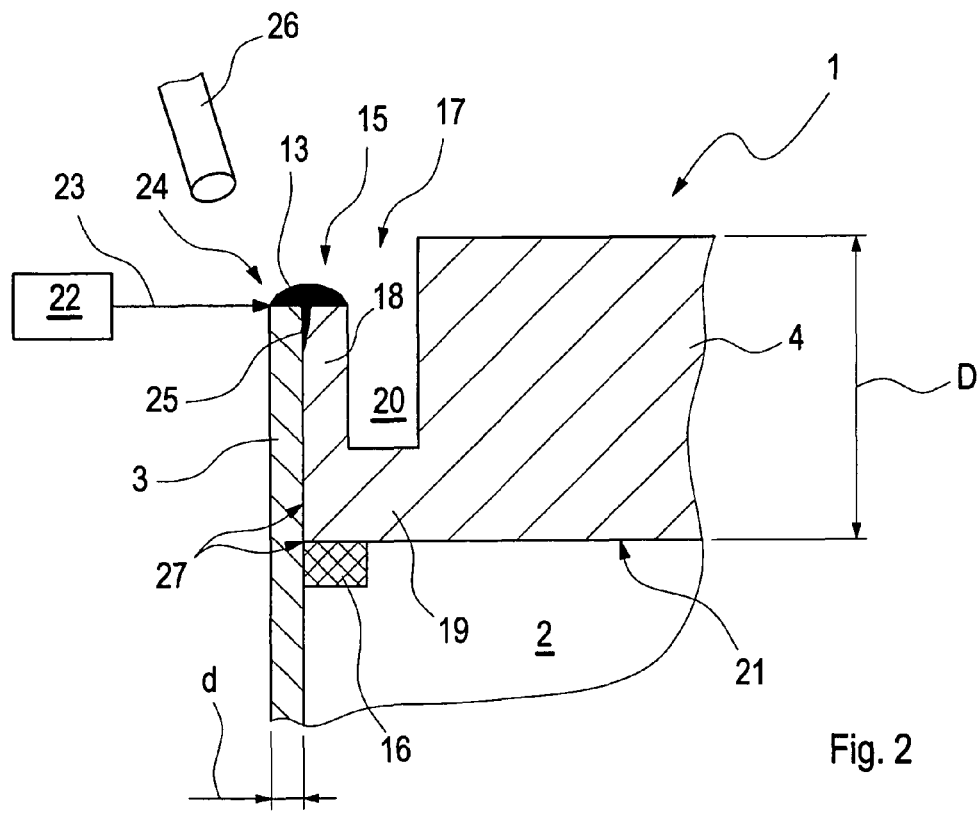
FIG. 2 shows an embodiment of a weld seam for joining two assemblies, in a schematic cross section.

The formation of weld seams 13 in the exemplary embodiment of detector capsule 1 illustrated in FIG. 1 is clarified in greater detail in the following with reference to FIG. 2. FIG. 2 shows an enlarged detail of join region 15 of detector capsule 1.

As already mentioned, capsule container 3 has a wall thickness of 1 mm. Thus, in accordance with DIN 1623, it is a thin sheet (in accordance with DIN 1623, a thin sheet is understood to be sheet metal having a thickness d of d≤3 mm) In comparison, cover 4 has a substantially greater thickness of D=15 mm in the present case. It comes under the definition of a plate in accordance with DIN EN 10029 (in accordance herewith, plates are defined by a thickness D of D≥3 mm) It is self-evident that other values may also be used for thickness d of capsule container 3 and/or for thickness D of cover 4. In the exemplary embodiment illustrated in the present case, both cover 4, as well as capsule container 3 are made of an aluminum alloy. The aluminum alloys of capsule container 3 and of cover 4 are selected to substantially correspond in the present case.

Cover 4 (which is formed as a circular disk, for example) and capsule container 3 (which takes on the shape of a circular, cylindrical cup, for example) are dimensioned to be able to fit very precisely into each other. In this context, a certain play (also referred to as tolerance) naturally remains in join region 15 of capsule container 3 and cover 4. In the exemplary embodiment illustrated in the present case, an H7 fit according to EN 20286 was realized. The narrow fit allows capsule container 3 and cover 4 to be mechanically pre-fixed prior to formation of weld seam 4. To this end, an outer diameter of 79.60 mm is selected for cover 4, for example, while the inner diameter of capsule container 3 is 81.40 mm. A supporting segment 16 provided on the inner side of capsule container 3 provides a further mechanical pre-fixing of cover 4 and capsule container 3.

As is readily discernible in FIG. 2, cover 4 has an undercut contact segment 18 in its edge area 17 facing the contact region that contacts capsule container 3 two-dimensionally and thereby forms contact region 27. Contact segment 18 is connected via a bridge segment 19 to actual cover 4. Contact segment 18 is undercut by a groove 20 located between contact segment 18 and main body 21 of cover 4.

As is likewise readily discernible from FIG. 1, the length of contact segment 18 is less than thickness D of main body 21 of cover 4. This protects join region 15 and weld seam 13 to a certain degree from external mechanical influences. In the exemplary embodiment illustrated in the present case, the length of contact segment (18) is 12 mm; the thickness of contact segment 18 is 0.9 mm; and the thickness of bridge segment 19 is 2 mm. It is self-evident that other dimensions may also be selected, such as a 2.5 mm length for contact segment 18 and a 9.5 mm thickness for bridge segment 19.

To join cover 4 and capsule container 3, a CO2 laser 22 produces a laser beam 23 which, in the exemplary embodiment illustrated in the present case, is incident on join region 15 in an end face portion 24 of capsule container 3 and cover 4. The laser power may be 2 or 2.5 kW, for example. In the present case, laser beam 23 is directed to join region 15, essentially normally to the surface of capsule container 3. It is self-evident that it is also possible for laser beam 23 to be directed at other angles to contact region 15. Angles of 0° (parallel to the surface of capsule container 3 in join region 15), of 30°, 45° and/or 60° are suitable in this case. Impinging laser beam 23 induces a local heating in end face portion 24 of join region 15. The parameters of laser beam 23 are adjusted to allow the aluminum alloy of capsule container 3 and of cover 4 to form a bond in pasty or liquid form, and, at the same time, a portion of the liquid mass to enter into contact region 27 between capsule container 3 and cover 4 within the predefined tolerance. A weld seam 13 is thereby formed. The liquid material, which has entered into contact region 27, forms weld root 25 that is discernible in FIG. 1. Due to the H7 fit selected in the present case, weld root 25 has only a small thickness following fabrication of weld seam 13, and, in particular, does not leak into capsule interior (hollow space 2).

At the same time as laser beam 23, a protective gas is directed into the region of weld seam 13 via a protective gas nozzle 26. This prevents an oxidation by atmospheric oxygen of the material in the region of weld seam 4. In the present case, neon is used as a protective gas. The protective gas supplied via protective gas nozzle 26 serves at the same time as what is generally referred to as a "cross jet." This means that combustion residues, which may have been released from the molten material (weld pool), are expelled by the gas jet from the weld pool into groove 20. This also makes it possible to prevent impurities from entering into hollow space 2 of detector capsule 1—thereby avoiding a surface contamination of semiconductor detector material 6.

Due to the undercutting of contact segment 18 with the aid of groove 20, only a small heat-conducting surface is available through which heat may be dissipated from weld seam location (join region 15). Thus, groove 20 acts as a thermal insulation device for forming weld seam 13. Naturally, the provision of groove 20 also results in a weakening of the mechanical strength of cover 4 in its edge area 17. However, since capsule container 3 constitutes the mechanically most critical portion of detector capsule 1 in this region, as is readily apparent in FIGS. 1 and 2, the weakening of the stability of cover 4 is essentially insignificant.

In the exemplary embodiment illustrated in FIG. 2, capsule container 3 and cover 4 may be welded together without filler materials and/or without welding fillers. Since it is possible to eliminate such materials, there is merely a minimal—if any at all—releasing of vapors during the welding process in the area of weld seam 13. This is very advantageous since semiconductor detector material 6, which is contained in the hollow space of capsule container 3, normally has a very sensitive reaction to such gas releases. Moreover, it should be noted that any potentially released vapors preferably escape upwardly (and thus not into hollow space 2 of detector capsule 1) since laser beam 23 impinges in end face portion 24 of capsule container 3 and contact segment 18 of cover 4. Moreover, relatively long contact region 27 (having an H7 fit) between capsule container 2 and contact segment 18 of cover 4 very effectively prevents gaseous materials from passing through into hollow space 2 of detector capsule 1. Moreover, supporting segment 16 may also provide an additional protection of hollow space 2 of detector capsule 1 from potentially released vapors. All of these properties and, in particular, the combination thereof protect semiconductor detector material 6 contained in hollow space 2 of detector capsule 1 highly effectively.

Another advantage of a welding of capsule container 3 and cover 4 in end face portion 24 is evident in that an opening (and as the case may be, a subsequent resealing) of detector capsule 1 sealed in this manner is very readily possible. Detector capsule 1 may be opened, for example, by subjecting weld seam area 13 (including weld root 25) to an appropriate temperature. A mechanical removal of end face portion 24 is also possible, however. Particularly in the case of a mechanical removal, the number of possible opening operations is naturally limited for geometric reasons.

It is self-evident that supporting segment 16 acts simultaneously as a contact surface, and thus as a type of "limit stop" that defines the distance between semiconductor detector material 6 and cover 4 of detector capsule 1. It is thereby also possible, in particular, that the distance between semiconductor detector material 6 and cover 4 may be kept constant, even following an optionally indicated, repeated opening and resealing of detector capsule 1.

Figure 3:
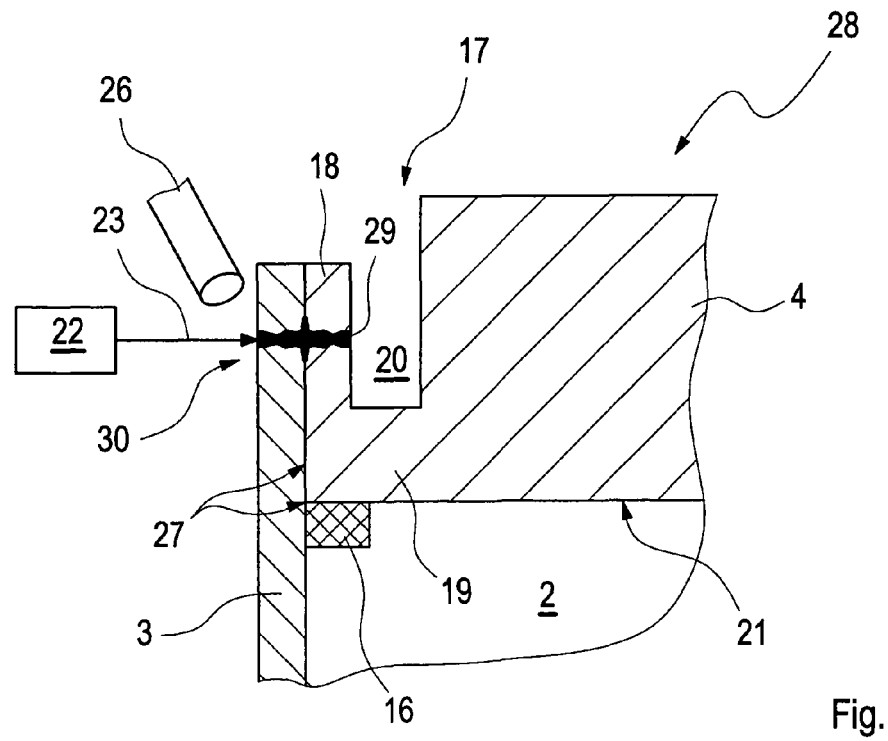

Another possible exemplary embodiment of a capsule-cover seal 28 is illustrated in FIG. 3. Analogously to FIG. 2, merely an enlarged detail is shown in a contact region 27 of cover 4 and capsule container 3. Apart from that, capsule-cover seal 28 illustrated in FIG. 3 corresponds to a large degree to join region 15 of detector capsule 1 shown in FIG. 2. Accordingly, equivalent components are denoted by the same reference numerals.

However, in contrast to FIG. 2, in the case of capsule-cover seal 28 shown in the present case, weld seam 29 is provided in a central area 30 of contact region 27 between capsule container 3 and contact segment 18 of cover 4. The bond features an especially high strength due to central configuration 30 of weld seam 29. It would, naturally, also be conceivable to combine a centrally configured weld seam 30 (FIG. 3) with a weld seam 13 that is configured at the edge (FIG. 2), in order to thereby achieve a bond that is reinforced once again.

In spite of the position of weld seam 29 in a central area 30 of contact region 27, virtually no gases that may have been released enter into hollow space 2 of detector capsule 1. This is because, in the present case, the front side of weld seam 29 (facing laser 22), in particular, however, the rear side of weld seam 29 (facing groove 20) may allow any potentially released gases to flow out. Thus, the potentially released gases escape via groove 20 toward the outside of detector capsule 1. Supporting segment 16 provided analogously to FIG. 2 also acts here as an additional barrier for gases that are potentially released in the area of weld seam 29.

Another capsule-cover seal 31 for a detector capsule 1 is illustrated in FIG. 4. In the exemplary embodiment illustrated in the present case, merely a thin web-type projection 32 is provided in edge region 17 of cover 4. Thus, a contact segment 18, as is provided in FIGS. 1, 2 and 3, is missing. One advantage of this type of configuration is that cover 4 is simpler to manufacture. In the exemplary embodiment illustrated in FIG. 4, weld seam 33 is configured at edge side 34 of web-type projection 32 facing the outer side of detector capsule 1. In this context, laser beam 23 is directed from outside of capsule container 3 through the same to contact region 27 between capsule container 3 and web-type projection 32 of cover 4. Once again, a supporting segment 16 may be provided for mechanical pre-fixing.

The thermal insulation of weld seam 33 illustrated in FIG. 3 is in the form of thin, web-type projection 32. In other words, due to the relatively small material cross section of web-type projection 32, only a relatively small amount of thermal energy is dissipated from weld seam 33. Thus, a very thin capsule container 3 may likewise be welded to a thick cover 4. Any combustion vapors potentially released in the area of weld seam 33 during the welding process may escape to the outside via the front side of weld seam 33 (outside of capsule container 3), in particular, however, also via hollow space 35 (formed by capsule container 3, web-type projection 32 and cover 4; in terms of function corresponds to groove 20). In this case as well, there is once again no relevant contamination of hollow space 2 of detector capsule 1; here, as well, supporting segment 16 functioning as an additional gas barrier.

FIGS. 5a-5d clarify in greater detail the vacuum-tight sealing of evacuation tube 12 of cover 4 of detector capsule 1 following evacuation of detector capsule 1.

A combination tool 36 is first applied to evacuation tube 12 in sealing region 14. Combination tool 36 has an anvil sonotrode 37 and a welding sonotrode 38 corresponding thereto which, together, form an ultrasonic welding tool 39. Configured adjacently to welding sonotrode 38 of ultrasonic welding tool 39 is additionally a cutting tool 40. Anvil sonotrode 37, welding sonotrode 38, as well as cutting tool 40 are movably mounted (for example, on robot arms) and may be moved accordingly. In some instances, a plurality of components of combination tool 39 may be mounted on a common holder and driven by suitable actuators.

Anvil sonotrode 37, as well as welding sonotrode 38 of ultrasonic welding tool 39 are designed to be relatively stable. This makes it possible for inner cross section 42 of evacuation tube 12 to be crimped together with the aid of combination tool 39 (in particular, using anvil sonotrode 37 and welding sonotrode 38) in such a way that the inner walls of evacuation tube 12 contact one another. The resulting crimped state is shown in FIG. 5b.

Once the crimped state of evacuation tube 12 is reached, as illustrated in FIG. 5b, anvil sonotrode 37 and/or welding sonotrode 38 of ultrasonic welding tool 39 are sonicated. An ultrasonic welding of the inner walls of evacuation tube 12 in sealing region 14 of evacuation tube 12 is thereby accomplished.

Figure 5:
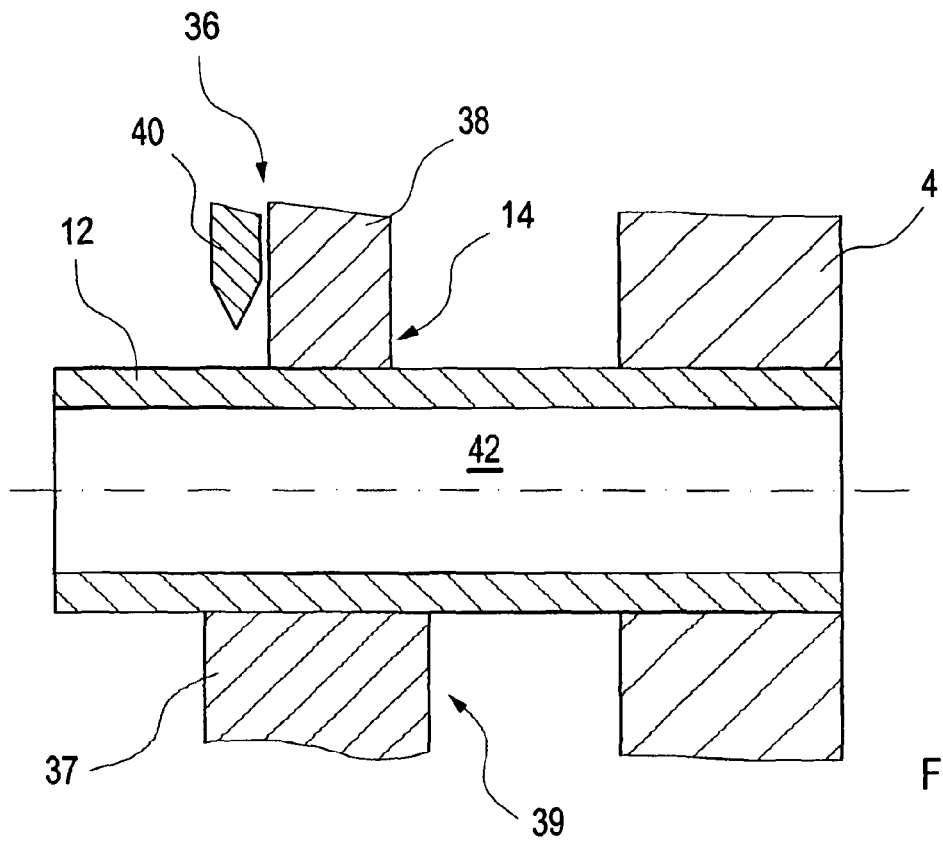
Figure 5:
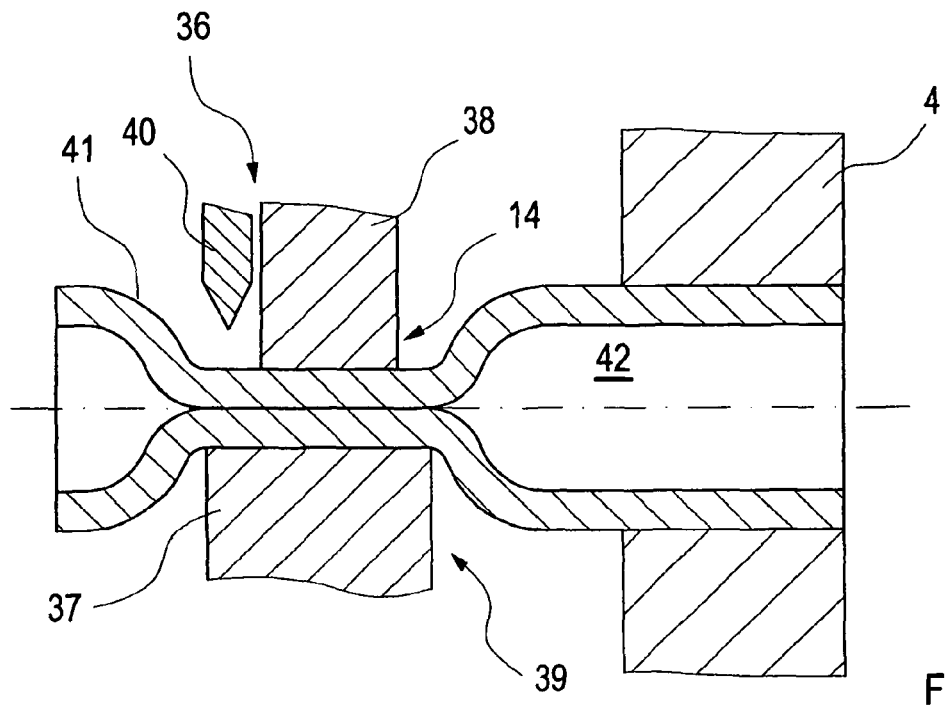
Figure 5:
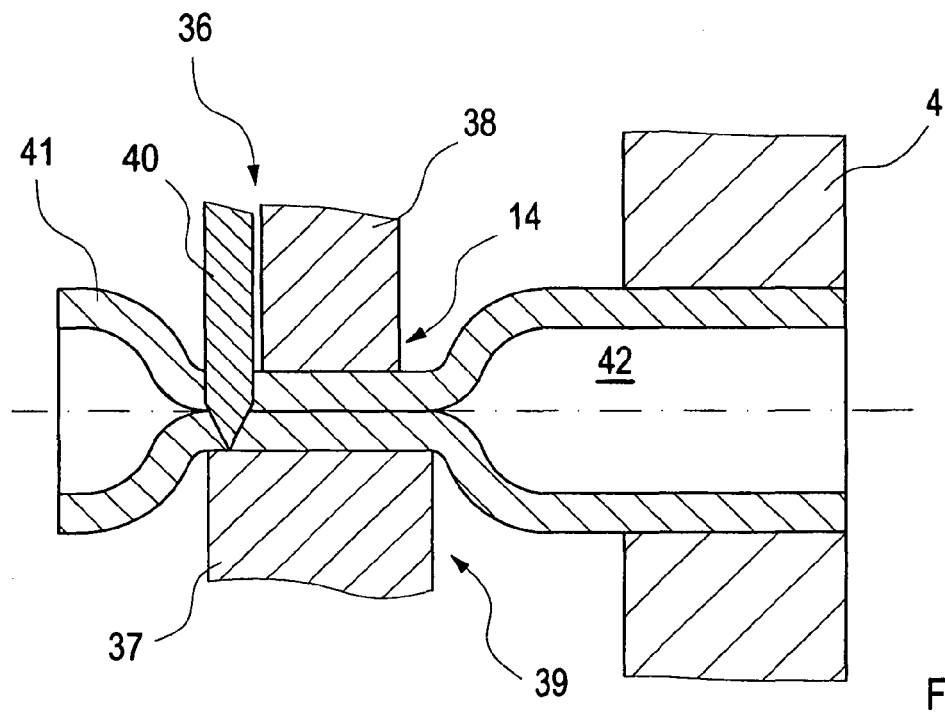
Figure 5:
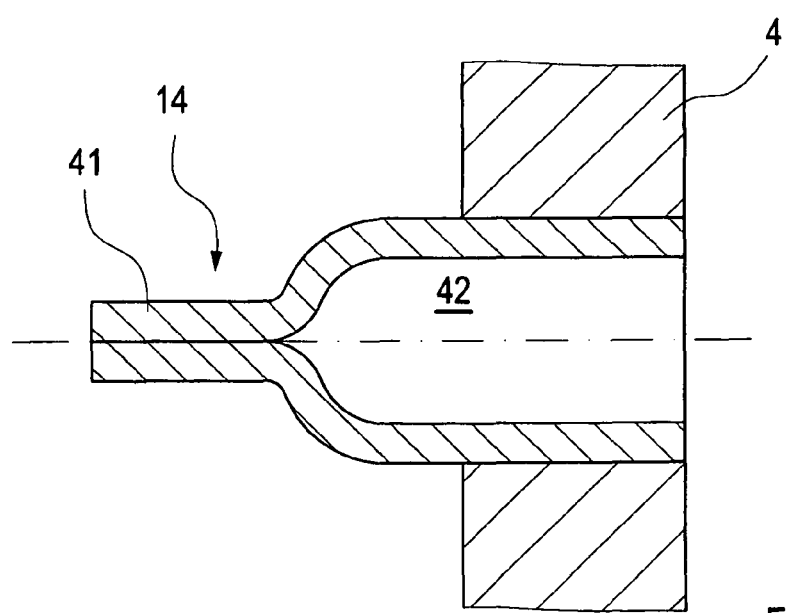

Once ultrasonically welded bond 14 of evacuation tube 12 is formed vacuum-tight in the exemplary embodiment illustrated in the present case, cutting tool 40 of combination tool 39 is urged forward, (in FIG. 5, downward). In this context, anvil sonotrode 37 and welding sonotrode 38 act, on the one hand, as a positioning means. On the other hand, anvil sonotrode 37 is designed to have such a width (in particular, wider than welding sonotrode 38) that it may serve simultaneously as a stop face for cutting tool 40. This is readily discernible in FIG. 5c, in particular.

Protruding section 41 of evacuation tube 12 is cut to length by the forward movement of cutting tool 40. FIG. 5d shows the configuration following completion of the cut-to-length process.

However, it is perfectly conceivable that protruding section 41 remains on evacuation tube 12. This is shown in FIG. 1.

Once evacuation tube 12 has been sealed vacuum-tight, thermally activable ion getter 7 is then activated. Thermally activable ion getter 7 may be a commercial St 172 SAES getter, for example. Thermally activable ion getters 7 of this material have a low activation temperature of 450° C. (given a large quantity of residual gas in hollow space 2, higher temperatures of up to 900° C. may even be necessary; however, given an adequate preparation of the components of detector capsule 1—for example by degreasing, cleaning, baking and polishing of the corresponding surfaces, respectively components—the required activation temperature may generally be left within a range close to 450° C.). For that purpose, thermally activable ion getter 7 is switched on or off step by step, i.e., periodically, every two minutes. This is accomplished by subjecting thermally activable ion getter 7 to a corresponding current intensity via electrical connecting lead 8. Thermally activable ion getter 7 is activated following ten minutes of treatment. Thermally activable ion getter 7 now serves as a "continuous vacuum pump."

One problem in the case of thermally activable ion getter 7 used in the present case is that, during the heating phase (for thermally activating ion getter 7 and/or, over the course of time, due to the absorption of gases by ion getter 7), small particles may flake off. However, a contacting of such particles of ion getter material and of semiconductor detector material 6 is to be avoided. For this reason, a filter disk 43 is configured between receiving space 9 and hollow space 2 of detector capsule 1. In the exemplary embodiment illustrated in the present case, filter disk 43 of detector capsule 1 is made of a mesh material, which is arranged in a plurality of superimposed layers. The mesh material itself is fabricated of stainless steel in the particular case, so that filter disk 43 is also able to be prepared in the customary manner for use in high-vacuum technology (for example, by cleaning, baking and the like). Thanks to filter disk 43, any particles, which potentially flake off from thermally activable ion getter 7, remain trapped in receiving space 9 within cover 4, and are, therefore, not able to damage semiconductor detector material 6.

Since the function of filter disk 43, namely the restraining of solid particles, may also be realized with a relatively large mesh aperture of the mesh material that is used, only a relatively small resistance results for the gas to be absorbed by thermally activable ion getter 7. As a result, a high-quality vacuum may be made provided in hollow space 2 of detector capsule 1. Due to the relatively large mesh aperture of the mesh material used for filter disk 43, it is normally still possible for light and/or infrared radiation to pass through. Therefore, filter disk 43 used in the exemplary embodiment illustrated in the present case usually does not have a thermally insulating effect. However, it is self-evident that it is also possible for filter disk 43 to also have a thermally insulating function, due to the formation, respectively configuration thereof.

An additional disclosure of the present invention described here is included in the German Patent Application that was filed on the same day at the German Patent and Trademark Office under file number GS108002-A of the Applicant as International Patent Application (PCT Application). The content of this Patent Application is incorporated by reference in its entirety in the disclosure of the present Patent Application.

LIST OF REFERENCE NUMERALS

1: detector capsule
2: hollow space
3: capsule container
4: cover
5: bottom
6: semiconductor detector material
7: thermally activable ion getter
8: electrical connecting lead
9: hollow space
10: voltage bushing
11: current lead
12: evacuation tube
13: weld seam
14: sealing region
15: join region
16: supporting segment
17: edge area
18: contact segment
19: bridge segment
20: groove
21: main body
22: CO2 laser
23: laser beam
24: end face portion
25: weld root
26: protective gas nozzle
27: contact region
28: capsule-cover seal
29: weld seam
30: central area
31: capsule-cover seal
32: web-type projection
33: weld seam
34: rear side
35: hollow space
36: combination tool
37: anvil sonotrode
38: welding sonotrode
39: ultrasonic welding tool 40: cutting tool
41: protruding section
42: inner cross section
43: filter disk

What is claimed is:

1. A housing for a device operated under at least one of a vacuum and a protective gas, the housing comprising:
a capsule container;
a cover configured to form a vacuum-tight connection with the capsule container;
a housing interior space enclosed by a lower surface of the cover and by one or more interior surfaces of the capsule container;
a receiving region located in a hollow space formed within the cover and configured to receive at least one getter material;
a connection between the housing interior space and the receiving region, the connection including a particle-hindering connection having at least one multilayer filter device including a plurality of mesh materials arranged in superimposed layers and extending over only a portion of the lower surface of the cover; and
a detector electrical connection lead routed, in a vacuum tight manner, through the cover into the housing interior space and configured to supply electrical current to a detector.

2. The housing recited in claim 1, wherein the cover is a solidly constructed cover.

3. The housing recited in claim 1, further comprising the at least one getter material.

4. The housing recited in claim 3, further comprising:
a getter electrical connection lead routed, in a vacuum-tight manner, through a portion of the cover into the receiving region located in the hollow space formed within the cover and to the at least one getter material in the receiving region, the getter electrical connection lead configured to energize the at least one getter material.

5. The housing recited in claim 3, wherein the at least one getter material is disposed in the at least one receiving region.

6. The housing recited in claim 5, Wherein the at least one getter material includes a thermally activable getter material.

7. The housing recited in claim 1, further comprising at least one thermal insulation device disposed in at least one join region in a vicinity of at least one material-to-material connection seam.

8. The housing recited in claim 7, wherein the at least one thermal insulation device includes a region of thinned material.

9. The housing recited in claim 8, wherein the region of thinned material is provided by a recess.

10. The housing recited in claim 9, wherein the region of thinned material is provided by at least one of a groove-type, recess and a web-type projection.

11. The housing recited in claim 1, wherein at least two joined together join regions differ in thickness, at least regionally.

12. The housing recited in claim 11, wherein the at least two join regions are joined together housing parts.

13. The housing recited in claim 1, wherein the housing includes at least two join regions, at least a region of the at least two join regions having at least one of a transition fit and a force fit.

14. The housing recited in claim 13, wherein the at least two join regions have an H7 fit.

15. The housing recited in claim 1, wherein the housing includes the capsule container and at least one of the cover and a housing bottom, and wherein at least one connection seam is included between the capsule container and the at least one of the cover and the housing bottom.

16. The housing recited in claim 1, wherein at least one housing part of the housing includes at least one material from the group including metal, metal alloys, aluminum, aluminum alloys, $AlMg_3$, $AlMg_{4.5}Mn$, steel, steel alloys, stainless steel, copper, copper alloys, nickel, nickel alloys, materials that have low evaporation rates and materials that are free of evaporation.

17. The housing recited in claim 16, wherein the at least one housing part is at least one join region.

18. The housing recited in claim 1, further comprising at least one connection seam having a separable design.

19. The housing recited in claim 18, wherein the at least one connection seam is a material-to-material connection seam.

20. The housing recited in claim 18, wherein the at least one connection seam is openable.

21. The housing recited in claim 18, wherein the at least one connection seam is openable and resealable.

22. A device opera able under at least one of a vacuum and a protective gas, the device comprising:
a housing including:
a capsule container;
a cover configured to form a vacuum-tight connection with the capsule container;
a housing interior space enclosed by a lower surface of the cover and by one or more interior surfaces of the capsule container; and
a receiving region, located in a hollow space formed within the cover and configured to receive at least one getter material;
a connection between the housing interior space and the receiving region, the connection including a particle-hindering connection having at least one multilayer filter device including a plurality of mesh materials arranged in superimposed layers and extending over only a portion of the lower surface of the cover; and
a detector disposed in the housing interior space; and
a detector electrical connection lead routed, in a vacuum-tight manner, through the cover into the housing interior space and configured to supply electrical current to the detector.

23. The device recited in claim 22, wherein the detector is a semiconductor detector.

24. The device recited in claim 22, further comprising a getter electrical connection lead routed, in a vacuum-tight manner, through a portion of the cover into the receiving region located in the hollow space formed within the cover and to the at least one getter material in the receiving region, the getter electrical connection lead configured to energize the at least one getter material.

* * * * *